United States Patent [19]

Madni

[11] 4,262,249
[45] Apr. 14, 1981

[54] BASE LINE CLIPPER FOR SPECTRUM ANALYZER DISPLAY

[75] Inventor: Asad M. Madni, Los Angeles, Calif.

[73] Assignee: Systron Donner Corporation, Concord, Calif.

[21] Appl. No.: 955,188

[22] Filed: Oct. 27, 1978

[51] Int. Cl.³ .............................................. G01R 23/16
[52] U.S. Cl. ................................ 324/77 B; 324/121 R
[58] Field of Search ................ 324/77 B, 121 R, 77 R

[56] References Cited

U.S. PATENT DOCUMENTS

| | | | |
|---|---|---|---|
| 3,475,681 | 10/1969 | Nerwin | 324/121 R |
| 3,728,623 | 4/1973 | Dubois | 324/77 B |
| 3,753,105 | 8/1973 | Harzer | 324/121 R |
| 3,971,011 | 7/1976 | Borchert | 324/121 R |
| 4,065,664 | 12/1977 | Kristof | 324/121 R |

Primary Examiner—Michael J. Tokar
Attorney, Agent, or Firm—Flehr, Hohbach, Test, Albritton & Herbert

[57] ABSTRACT

A base line clipper for a spectrum analyzer display uses a five position momentary switch to move the base line in the up or down directions in either a fast or slow mode. This is especially useful in conjunction with the spectrum analyzer which has a variable horizontal scan time because of its dot connecting technique.

3 Claims, 4 Drawing Figures

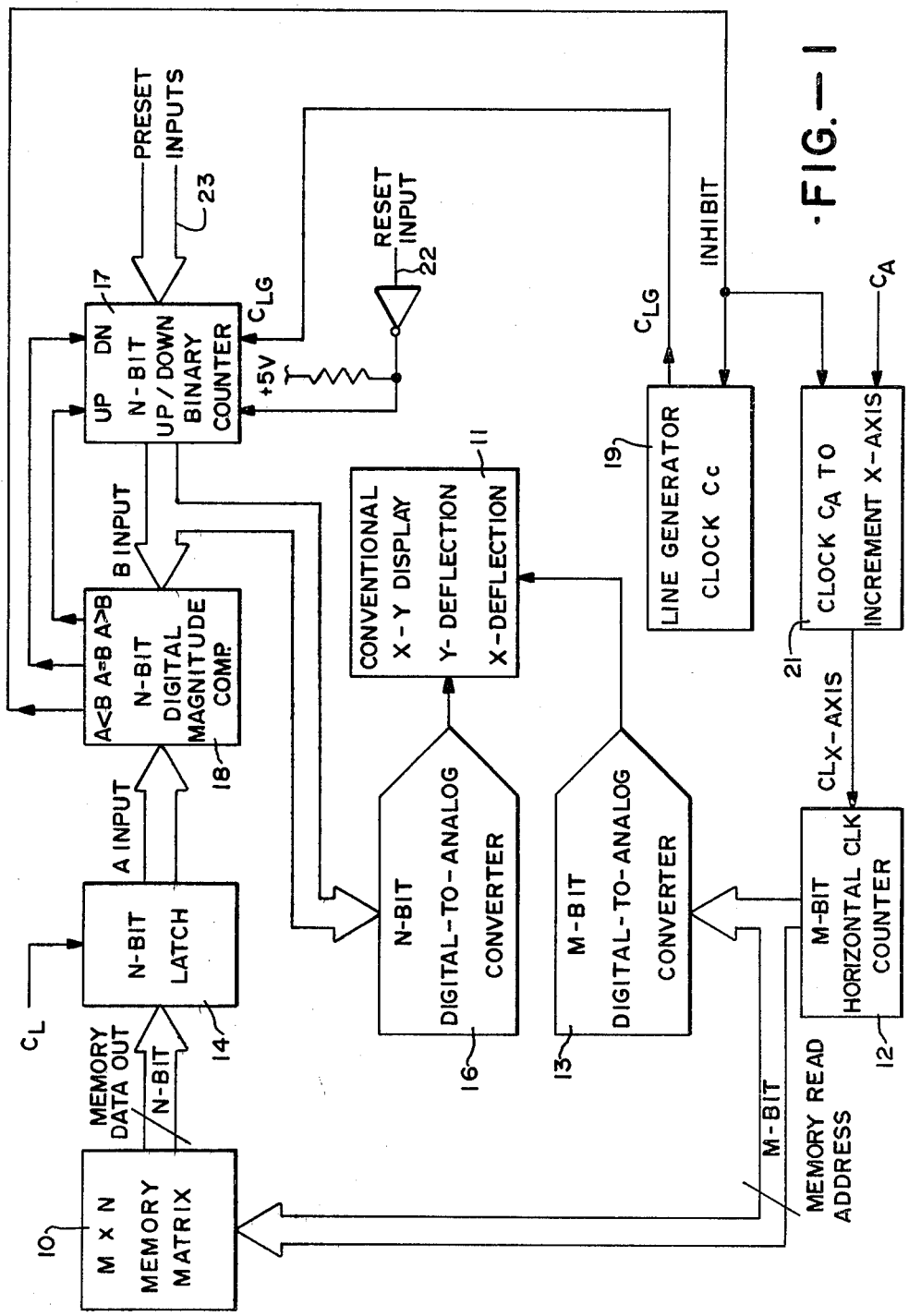

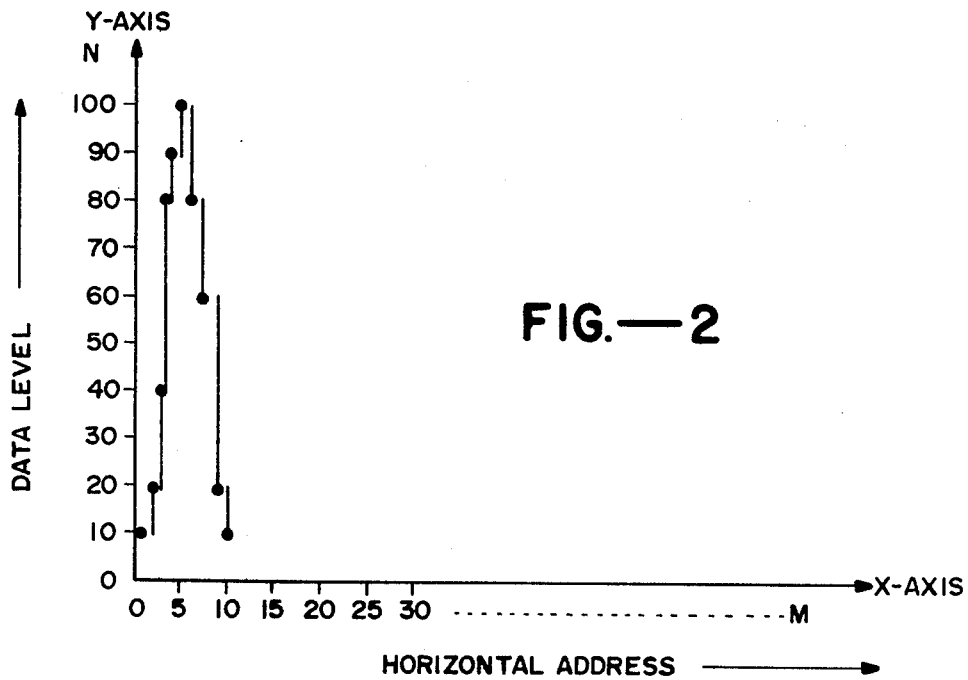
FIG.—2
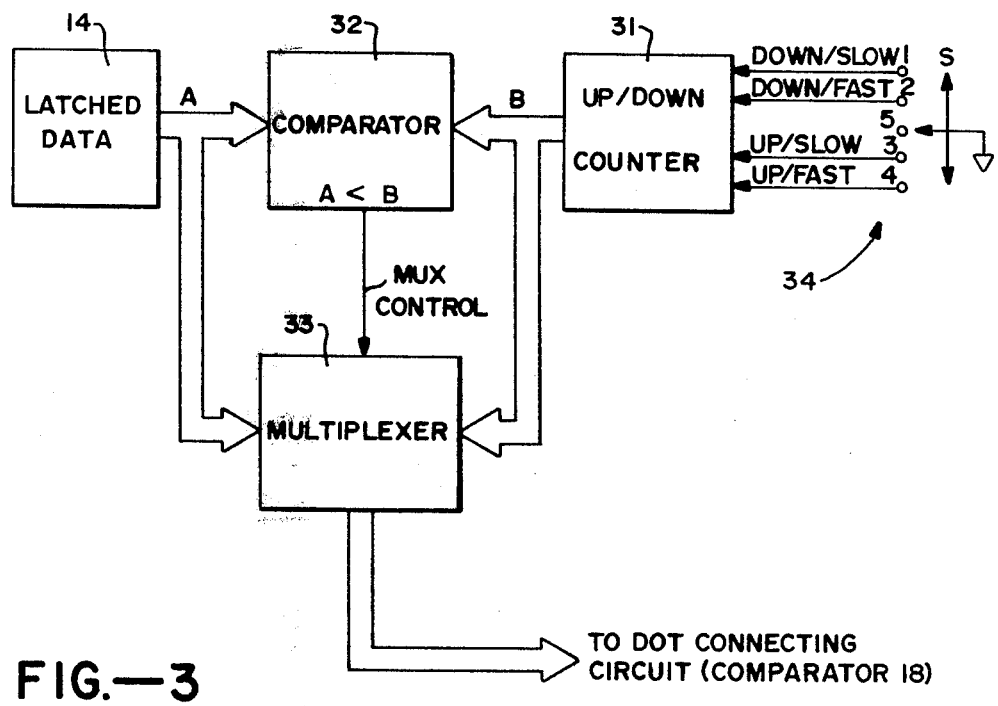
FIG.—3

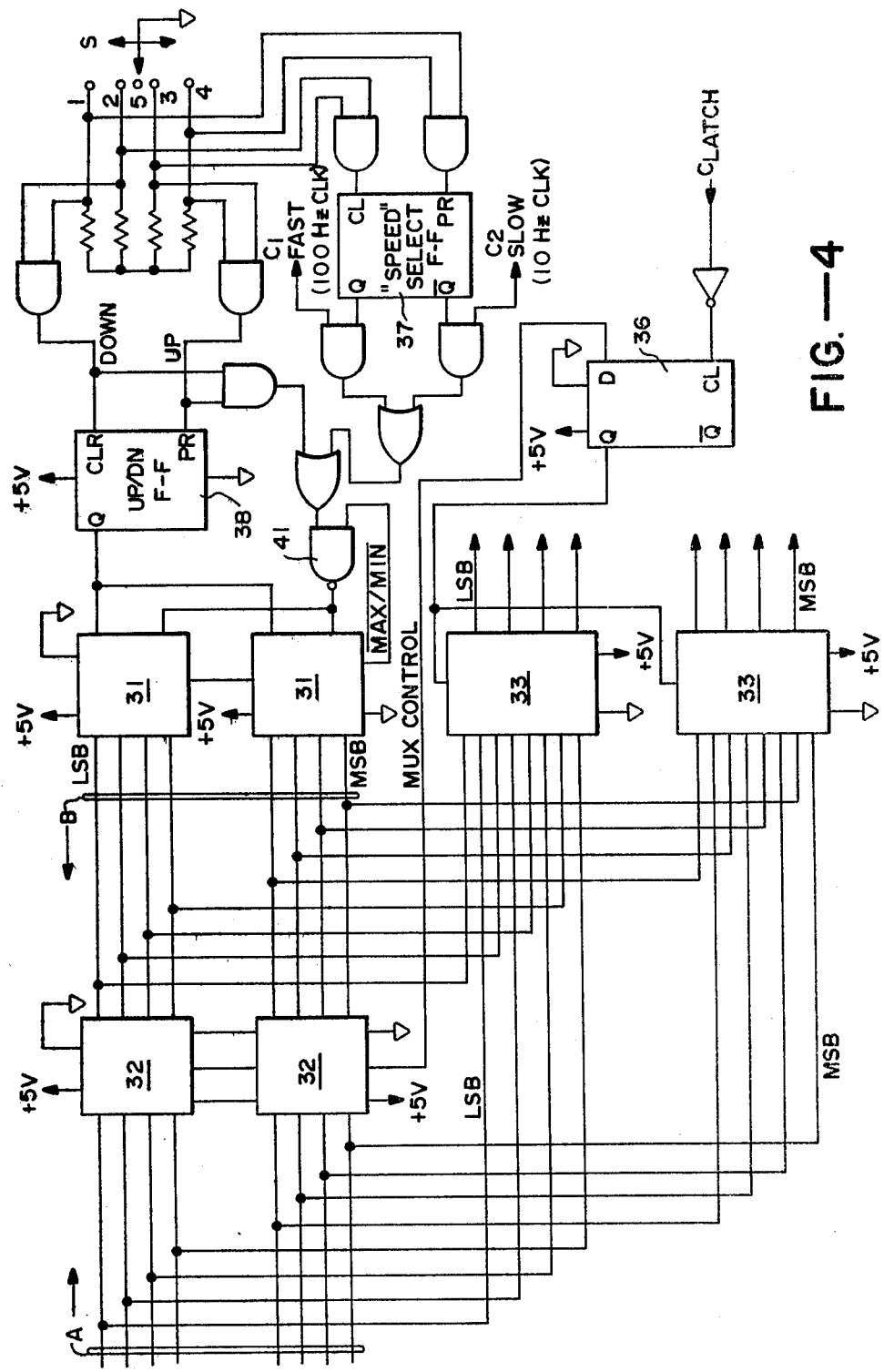
FIG.—4

BASE LINE CLIPPER FOR SPECTRUM ANALYZER DISPLAY

The present invention is directed to a base line clipper for spectrum analyzer display.

Base line clippers or threshold control as it is sometimes termed is commonly used in cathode ray tube displays to eliminate noise. In other words, there is a threshold level below which any signal is considered to be noise.

It is, therefore, an object of the present invention to provide an improved base line clipper for a spectrum analyzer display.

In accordance with the above object there is provided spectrum analyzer apparatus which includes a cathode ray tube display and a digital memory for storing data points at addresses corresponding to horizontal scan addresses of the display. An up/down binary counter stores binary data representing a limit value below which a stored data point will not be displayed. Comparator means compare the stored data points with the limit value. Multiplexer means are coupled to the display means and responsive to the comparator means for sensing a data point less than the limit value for causing display of the limit value rather than the data point. Control means are connected to the up/down counter for selectively causing the counter to count up or down at either a fast or slow rate to thereby change the limit value.

FIG. 1 is a block diagram of a spectrum analyzer with which the base line clipper of the present invention is useful;

FIG. 2 is a graph illustrating the operation of the spectrum analyzer of FIG. 1;

FIG. 3 is a simplified block diagram embodying the present invention; and

FIG. 4 is a detailed block diagram of FIG. 3.

Referring to FIG. 1, an M×N memory matrix 10 provides the digital storage for the XY display 11. Such memory matrix is typically the digital storage unit of a spectrum analyzer. Each N bit data word which represents a Y data point on the display (that is the amount of signal at a particular frequency), is stored at various M memory addresses which correspond to the X or horizontal axis of display 11; in other words the frequency scan axis. Referring briefly to FIG. 2, this illustrates the N data levels of the display and the M horizontal address or frequency axis. An M bit horizontal counter 12 provides the read addresses for memory 10 and additionally besides addressing the memory also drives an M bit digital to analog converter 13 the scaled output of which produces the necessary X deflection for the display 11. The data level, N, is read out of the memory matrix 10 into an N bit latch 14 which is clocked by a clock input $C_L$. Eventually as will be described below, this N bit data is converted or scaled by digital to analog converter 16 to drive the Y reflection circuit of display 11. As thus far described, the circuit is substantially equivalent to a typical digital storage type spectrum analyzer.

As disclosed and claimed in a concurrently filed corresponding application in the name of the present inventor entitled "Apparatus for Connecting Data Points on a Cathode Ray Tube Display and Method Therefor" (and such disclosure is hereby incorporated by reference). There is provided a technique of generating lines of constant intensity between data points presented on the screen. As illustrated in FIG. 2, the N bit digital to analog converter 16 (which drives the Y deflection circuits of the XY display 11) is driven by N bit up/down binary counter 17. This counter is controlled in direction by an N bit digital magnitude comparator 18 which compares the A input of N bit latch 14 and the B input of up/down counter 17. As indicated, if A is less than B, the counter is forced to count down; if A is greater than B, the counter counts up; and if A is equal to B, then another function takes place. Specifically, this output of the comparator is designated an INHIBIT line which inhibits a line generator clock 19. This line generator generates a clock $C_C$ on its output line designated $C_{LG}$ which drives the up/down binary counter. The INHIBIT line from comparator 18 also enables the clock $C_A$ which increments the X axis horizontal scan by clocking horizontal counter 12.

Counter 12 also includes a standard reset input 22 and preset inputs 23 which are used for initializing the circuit.

The above dot connecting technique is illustrated in the digital display of FIG. 2 where vertical lines are generated which effectively connect one dot with another. These vertical lines are generated at a single horizontal address which is inhibited for a time equal to that necessary to draw the vertical line. In order to provide for equal or constant intensity of the connecting lines the horizontal scan is inhibited for a time period necessary to draw each vertical connecting line at a constant rate irrespective of the distance or vertical displacement between dots. Thus, the overall display time may be lengthened by the presence of many low level signals near the noise level. A purpose of the present invention is to allow for easy adjustment of a base line level to eliminate some of the data points to thus decrease the overall scan time for a single frame of the display.

FIG. 3 illustrates such a circuit which includes an up/down binary counter 31 which stores binary data representing a limit value below which a stored data point will not be displayed. Such stored data points are originally stored in the memory matrix 10 (FIG. 1) and then latched into the latch 14. The output of the latched data unit 14 is the A input to comparator 32 and is compared to the contents of counter 31 which provides the B input to comparator 32. If A is less than B, control action takes place via the multiplexer 33 which causes the multiplexer to display such B input by coupling it to the dot connecting circuit and specifically comparator 18 of FIG. 1. It should be noted that during this procedure the memory contents of memory 10 have not been altered.

Since the presence of noise or the type of signal being analyzed is quite variable the up/down counter 31 is supplied with the proper control inputs to provide a versatile technique for changing the threshold or limit value level. This is indicated by the control inputs 34 which vary the counter in an up or down direction in either a slow or fast mode. Specifically, as indicated at 34, this control is accomplished by a five position momentary switch S. Such a switch is available from the Ledex Corporation. The various switch positions and their functions are illustrated. It is apparent that such control is especially valuable with a dot connecting technique, which as discussed above, which may lengthen the overall scan time because of connection of a large number of data points or dots.

Referring now to the detailed block diagram of FIG. 4, an eight bit B input from latch unit 14 is coupled both to comparator 32 represented by two separate integrated circuits and in addition to multiplexer unit 33 which consist of two separate integrated circuits. The B input to comparator 32 is provided by the two integrated circuit unit up/down counter 31 which also has its B input connected to multiplexer unit 33. A multiplex control line from comparator 32, selects the greater value of either the A data or the B input. In this manner the display shows only that portion of the signal which is greater than a selected threshold. If the signal value is less than the threshold, the threshold is displayed on the screen.

Data from the memory output A is latched at the positive going edge of a C latch pulse which clocks a D flip-flop 36. This D flip-flop processes the multiplex control line to provide a delay insuring that the data and the latch unit output 14 is stable before the multiplexer 33 makes a selection.

The remaining circuitry illustrated is controlled by the five position momentary switch S to provide the control action which selects the speed and direction of base line movement. When the wiper of the switch makes contact with position 1 or 4, the Q output of speed select flip-flop 37 is set to a logic 1 and the fast clock $C_1$ which in this case is 100 Hz clocks through the various gates the counter 31. When the wiper makes contact with positions 2 or 3, the $\overline{Q}$ output of flip-flop 37 is set to a logic 1 and the slow clock $C_2$ (which is 10 Hz) drive the counter. In this manner the two different clock rates which move the base line are selected.

The direction of base line movement is selected as follows; when the wiper makes contact with position 1 or 2, the Q output of up/down flip-flop 38 goes to a logic 0 and the counter 31 counts down. In positions 3 or 4, the Q output is set to a logic 1 and the counter counts up. When the switch is released because of its momentary switch nature and moves to position 5 the clocking to the counter is disabled, thus stopping the base line in the last vertical position.

The $\overline{\text{MAX/MIN}}$ counter OUTPUT which is line 39 disables the clocking via the gate 41 when the counter reaches a count of all ones in the up mode or all zeroes in the down mode so that the base line stops when it reaches either the top or bottom of the cathode ray tube display screen.

The vertical data resolution determines the number of discrete levels at which the base line can be set. For an eight bit data system, the base line can go through 256 discrete levels.

By the use of the jam inputs and preset enable (not shown) of counter 31 the base line level is also remotely controllable.

In summary, the present base line control scheme while especially applicable to a spectrum analyzer of the above referenced copending application where the horizontal scan is inhibited to allow drawing a vertical dot connecting line, is also applicable to other types of spectrum analyzers because of its superior control capability.

What is claimed is:

1. Spectrum anayzer apparatus including a cathode ray tube display and a digital memory for storing data points at addresses corresponding to horizontal scan addresses of said display comprising: an up/down binary counter said counter storing binary data representing a limit value below which a stored data point will not be displayed; comparator means for comparing said stored data points with said limit value; multiplexer means coupled to said display and responsive to said comparator means sensing a data point less than said limit value for causing display of said limit value rather than said data point; and control means connected to said up/down counter for selectively causing said counter to count up or down at either a fast or slow rate to thereby change said limit value.

2. Apparatus as in claim 1 where said control means includes a five position momentary switch where in its stable position no control action occurs, in a first two adjacent momentary positions the counter is counted up at a selected slow or fast rate and in second two adjacent momentary positions the counter is counted down at a selected slow or fast rate.

3. Apparatus as in claim 1 incuding means for connecting said data points on said display such means inhibiting said horizontal scan of said display until the vertical scan of said display has produced an effective vertical line connecting two data points said time of inhibiting varying in proportion to the vertical displacement of said data points.

* * * * *